(12) United States Patent
van der Goes et al.

(10) Patent No.: US 8,598,906 B2
(45) Date of Patent: Dec. 3, 2013

(54) LOW-POWER ETHERNET TRANSMITTER

(75) Inventors: Frank van der Goes, The Hague (NL);
Christopher M. Ward, Utrecht (NL);
Jan Mulder, Houten (NL); Ovidiu Bajdechi, Delft (NL)

(73) Assignee: Broadcom Corporation, Irvine, CA (US)

( * ) Notice: Subject to any disclaimer, the term of this patent is extended or adjusted under 35 U.S.C. 154(b) by 1288 days.

(21) Appl. No.: 11/798,334

(22) Filed: May 11, 2007

(65) Prior Publication Data

US 2007/0296456 A1    Dec. 27, 2007

Related U.S. Application Data

(60) Provisional application No. 60/799,346, filed on May 11, 2006.

(51) Int. Cl.
*H03K 19/17* (2006.01)

(52) U.S. Cl.
USPC ............. 326/37; 326/30; 326/83; 326/87; 327/108

(58) Field of Classification Search
USPC ......... 326/81–83, 86–87, 26, 21, 30; 327/108–109; 375/257–258; 370/84, 370/85.3; 333/119, 126, 100, 131
See application file for complete search history.

(56) References Cited

U.S. PATENT DOCUMENTS

| | | | | |
|---|---|---|---|---|
| 5,541,957 A | * | 7/1996 | Lau | 375/258 |
| 6,087,861 A | * | 7/2000 | Cranford et al. | 327/108 |
| 6,700,403 B1 | * | 3/2004 | Dillon | 326/37 |
| 6,870,390 B1 | * | 3/2005 | Groen et al. | 326/27 |
| 6,891,440 B2 | * | 5/2005 | Straub et al. | 331/1 R |
| 7,548,726 B1 | * | 6/2009 | Rofougaran | 455/20 |
| 2001/0007151 A1 | * | 7/2001 | Vorenkamp et al. | 725/151 |
| 2004/0105504 A1 | * | 6/2004 | Chan | 375/257 |

* cited by examiner

*Primary Examiner* — Shawki Ismail
*Assistant Examiner* — Christopher Lo
(74) *Attorney, Agent, or Firm* — Sterne, Kessler, Goldstein & Fox, P.L.L.C.

(57) ABSTRACT

An electrical circuit comprising a line driver for providing Ethernet signals is disclosed. The line driver comprises a voltage mode line driver for producing 1000BT and 100BT Ethernet signals and an active output impedance line driver arranged parallel to the voltage mode line driver. The line driver is capable of producing 1000BT or 100BT or 10BT Ethernet signals, wherein either the voltage mode line driver or the active impedance line driver is active.

36 Claims, 7 Drawing Sheets

US 8,598,906 B2

LOW-POWER ETHERNET TRANSMITTER

CROSS-REFERENCE TO RELATED APPLICATIONS

This application claims benefit to U.S. Provisional Application No. 60/799,346, filed on May 11, 2006, which is incorporated by reference in its entirety herein.

BACKGROUND OF THE INVENTION

The Institute of Electrical and Electronics Engineers (IEEE) inter alia sets the standards for communication devices interchanging information using the Ethernet protocol in order to enable for example different manufacturers to produce devices complying with the same specifications and thus being compatible to each other. For example 10BT is a well known Ethernet standard protocols for transmitting digital information at a transmission speed of 10 Mbit/s, 100BT defines digital data transmission at 100 Mbit/s and 1000BT defines the transmission at 1000 Mbit/s=1 Gbit/s.

The IEEE 802.3 standard defines the requirements for the combined 10BT/100BT/100BT transmitters using unshielded twisted pair (UTP) lines. That is IEEE 802.3 for example defines what voltage levels should be output on the lines, how the switching between the different voltage levels defined for the protocols should be handled and what termination impedance should be guaranteed on the line.

For the transmission protocols different requirements are specified in the standard. For example the highest transmitter linearity is required in 1000BT in the presence of an interferer put on the line in full duplex. The highest accuracy of signals is required in 100BT mode when fast settling with accurate rise time and accurate output voltage are specified. The 10BT protocol requires the highest voltage swing.

Conventional solutions for a combined transmitter being able to output signals according to all three protocols use a single complex current-mode digital-to-analog converter (DAC) to shape the edges of the 100BT and 1000BT waveforms and provide a very accurate equalization in 10BT mode. It is known that meeting the defined requirements of transmission speed, signal accuracy, linearity and output voltage swing with the same transmitter proves costly in terms of power consumption. To meet the 100BT/1000BT amplitude requirements and to keep the proper line termination, for example by means of a resistor parallel to the driver the current-mode DAC need a full-scale current of 40 mA. If the driver is operated in 10BT mode the same current-mode DAC needs a full-scale current of 100 mA to meet the specifications of this protocol, which specifies larger signal amplitude, namely 5V peak-to-peak, for 10BT. The specification of the large amplitude in 10BT furthermore requires a common voltage at the DAC output of at least 1.8 Volts. The power consumption of the transmitter thus results in 72 mW when operating in 100BT or 1000BT mode and in 180 mW in 10BT mode. Furthermore the list of materials needed for the final assembled product is increased by a low dropout regulator (LDO) located off the chip, which supplies a center-tap current for the current-steering DAC.

Following from the afore mentioned specifications there is a need for a transmitter capable of producing output signals according to the 10BT and the 100BT and the 1000BT specifications with low power consumption on a small silicon area.

SUMMARY OF THE INVENTION

The invention relates to an electrical circuit comprising a line driver for providing Ethernet signals, the line driver comprising a voltage mode line driver parallel to an active output impedance line driver.

Furthermore a method is disclosed for producing an Ethernet signal from an analog signal reflecting the symbols to be transmitted, wherein the analog signal is fed into a voltage mode line driver for producing a 100BT or 1000BT Ethernet signal, and wherein the analog signal is fed into an active impedance line driver for producing a 10BT Ethernet signal.

DESCRIPTION OF THE FIGURES

The accompanying drawings, which are incorporated herein and form a part of the specification, illustrate the present invention and together with the description, further serve to explain the principles of the invention and to enable a person skilled in the pertinent art to make and use the invention.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known processes and steps have not been described in detail in order not to unnecessarily obscure the present invention.

Figure 1:
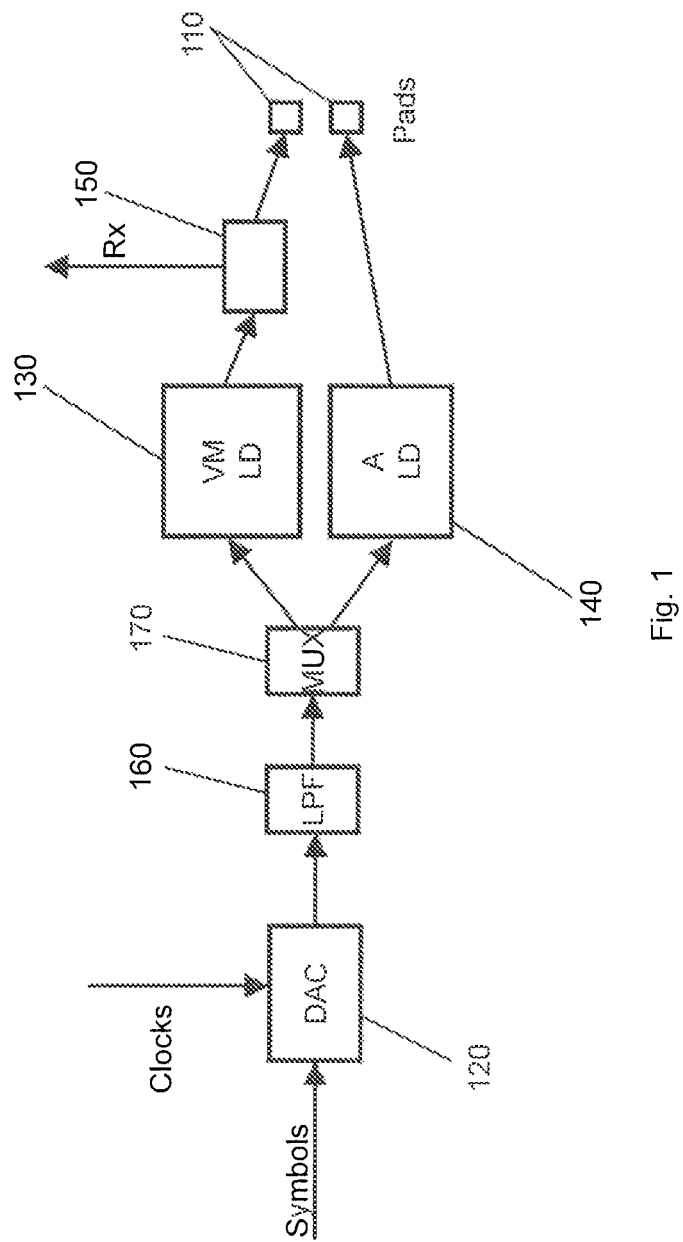
FIG. 1 depicts an overview of the driver circuit

FIG. 1 illustrates a schematic of the invention. Elements or processing blocks in circuit 100, which generate the symbols to be transmitted are omitted in the drawing. Only the last elements in the processing chain of a chip are illustrated, which process the information to be signaled over a line before the signals leave the chip at the connection pads 110 of the chip. The connection pads may be coupled to a cable or line according to the standards as defined in the IEEE 802.3 standard.

Digital symbols to be transmitted are fed into a digital-to-analog converter (DAC) 120, which at the same time receives suitable clock signals corresponding to the transmission speed of the signal output at the pads 110. DAC 120 outputs analog signals corresponding to its digital input signals, i.e. the digital symbols. Depending on the transmission speed at which the signal will be output at pads 110 the analog signal is processed by either the voltage mode line driver 130 or the active impedance line driver 140. The analog signal accordingly is multiplexed to either of the line drivers by two current-steered FET transistors, shown as multiplexer 170 in the drawing.

If the analog signal output of DAC 120 is to be sent as 100BT or 1000BT signals, then the voltage mode line driver 130 will be active and will process the incoming signal to produce corresponding 100BT or 1000BT signals respectively. The active output impedance line driver 140 is inactive while the voltage mode line driver 130 processes the signal to leave the 100BT or 1000BT signal generated by the voltage mode line driver unaffected.

The signals output by the voltage mode line driver pass the Rx block 150 unmodified and are coupled to the pads of the chip.

As the 1000BT protocol is full duplex, i.e. signals can be sent to and received from a remote station at the same time and on the same line, the path from the voltage mode line driver to the pads includes Rx block 150, which filters incoming signals, i.e. Rx signals and forwards them for further processing.

In case that the symbols are to be sent as 10BT signals, then DAC 120 will be clocked by an appropriate clock signal and output a corresponding analog signal, which will be processed by the active output impedance line driver 140 outputting a corresponding 10BT signal. The voltage mode line driver 130 is inactive in this case, i.e. does not produce any output in order to keep the 10BT signal unaffected.

In this way the analog signal output by DAC 120 is processed by one of the two line drivers, while the second line driver is inactive, i.e. does not produce any voltage at its respective output and provides a very high output impedance, i.e. much higher than the impedance of the transmission line coupled to the pads, to leave the signal generated by the first driver unaffected.

The processing of the symbols using the circuit depicted in FIG. 1 comprises method steps according to the elements shown. In a first step the symbols to be transmitted for example as a signal as defined in the IEEE Ethernet standard is fed into a digital-to-analog converter 120, which outputs an analog signal corresponding to the input symbols. Depending on the speed of the signal to be produced the analog signal is then fed either to the voltage mode line driver 130 for example for generating a 100BT or a 1000BT Ethernet signal or to the active output impedance line driver for generating a signal according to the IEEE 10BT Ethernet specification. Accordingly and for preventing a mix up of generated signals either the voltage mode line driver 130 or the active output impedance line driver 140 processes the analog signal output from DAC 120. The Ethernet signal output from either of the line drivers is coupled to termination pads of the chip carrying circuit 100.

Typically circuit 100 and the corresponding signal processing method can be used in a transmission system changing transmission speeds during a data transfer. For example an electrical circuit comprising circuit 100 can be initially powered up in 10BT mode. In the initial negotiation with a remote transceiver the communication may start using 10BT mode, wherein in circuit 100 the analog signal output from DAC 120 is fed to the active output impedance line driver. If the remote transceiver is capable of processing 100BT Ethernet or 1000BT Ethernet signals, then one of these higher speed protocols may be negotiated. Circuit 100 accordingly switches the transmission speed by feeding the signals output from DAC 120 to the voltage mode line driver 130 to produce signals according to the protocol agreed between the transceivers.

In a variation of the circuit depicted in FIG. 1 DAC 120 can be a 17-level DAC followed by a low-pass filter 160, which can be implemented in the feedback paths of the amplifiers comprised in the voltage mode line driver and in the active output impedance line driver.

For 1000BT mode a PAM-5 (5 level) coding scheme is followed by a first-order partial response filter that increases the number of levels to 17, as required by the IEEE specification. Thus the resolution of the 17-level DAC matches the specification. Each symbol is generated by a single step output from the DAC every 8 ns. The low-pass filter is configured to have its single pole at 94 MHz to correctly shape the output signal as given in the IEEE specifications. To ensure this pole does not change with process variations a calibration circuit locks the pole at 94 MHz to an accurate time reference, which in this case is a 125 MHz clock.

The resulting 1000BT output waveform has a rise time of 3.7 ns and passes all templates and required IEEE specifications.

For 100BT mode a MLT-3 (3 level) coding scheme is given in the specification. A first intermediate step is made to 50% of the final amplitude, and an final step is made 2 ns later to 100% of the final amplitude. In this case the final step is added 2 ns after the start of the symbol time, which is 8 ns. Only 5 of the 17 available DAC levels are therefore used. The low-pass filter is configured to have its single pole at around 141 MHz to correctly shape the output signal. An additional clock signal is used to start the final step at 2 ns. Note that the pole frequency is not critical for 100BT mode. Also note that other, similar combinations of multi-step DAC outputs, separated by a similar time delay, followed by single or multiple pole filtering can meet the requirements.

The resulting 100BT output waveform has a rise time of 3.7 ns, settles to 1% of its final value in 6.5 ns.

For 10BT mode an equalizer preceding the DAC creates a shaped pulse based on a raised cosine. This pulse is quantized to 17 levels and fed to the DAC. The DAC is clocked at 160 MHz and updates its output every 6.25 ns to create the full symbol lasting 100 ns; therefore, 16 DAC samples make up one 10BT symbol. The low-pass filter is configured to have its single pole at around 80 MHz to correctly shape the output signal. Note that the pole frequency is not critical for 10BT mode and that clocking rates other than 160 MHz are suitable.

The resulting 10BT output waveform contains its highest unwanted harmonic at −25 dB below the carrier and correctly passes all templates and required IEEE specifications.

In this way the combination of the DAC followed by the low-pass filter allows the use of a low-complexity DAC comprising only 17 levels. A single-pole low-pass filter can be implemented easily using only passive components, thus saving power. These two analog circuits together can be configured to meet all IEEE specifications for all 3 modes of operation without having to add additional circuitry.

As mentioned above the single-pole low-pass filters can be implemented in the feedback paths of the amplifiers comprised in the line drivers. Accordingly the feedback path of the voltage mode line driver implements an adjustable single-pole low-pass filter, which can be adjusted to a pole frequency of around 94 MHz for processing 1000BT Ethernet signals and to a pole frequency of around 141 MHz for processing 100BT Ethernet signals.

Figure 2:
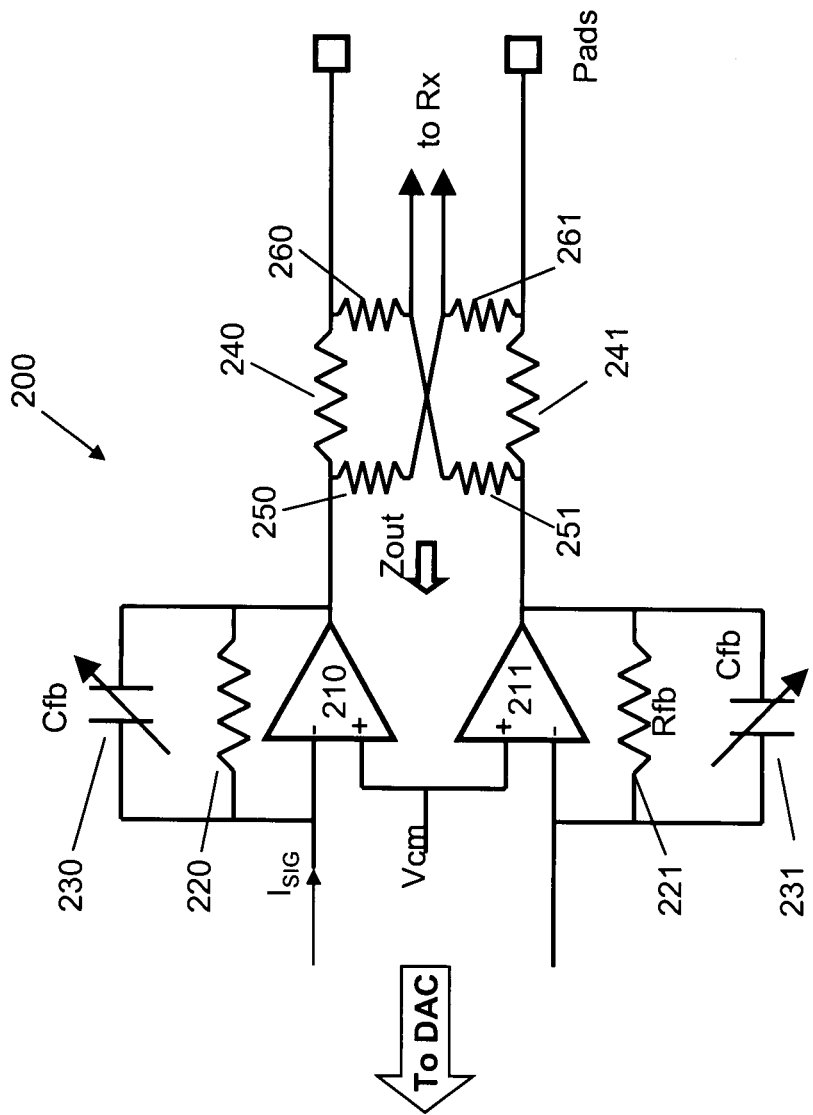
FIG. 2 illustrates an embodiment of a voltage mode line driver

Circuit 200 as depicted in FIG. 2 exemplifies a voltage mode line driver 130. It is to be noted that other topologies of voltage mode line drivers can be used, as long as these are line drivers of the voltage mode type, i.e. the output impedance Zout of the line driver is zero.

As indicated by the arrow circuit 200 is coupled to a digital-to-analog converter, which is DAC 130 as shown in FIG. 1. The DAC provides a current Isig as input signal to circuit 200. In case that the DAC provides a voltage-mode output, then circuit 200 is coupled by a conventional voltage-to-current converter.

Voltage mode line driver 200 consists of a pseudo-differential transimpedance amplifier. The symbol dependent input current Isig is coupled to the negative input terminals of a first and a second operational amplifier 210 and 211. The positive input terminals of the amplifiers are coupled to a common mode voltage Vcm.

Input current flows through feedback resistors 220, 221 thus generating the output voltage of the driver specified by the IEEE Ethernet standard and corresponding to the digital symbol to be transmitted.

Capacitors 230, 231 are arranged parallel to the feedback resistors 220, 221 thus forming a 94 MHz low-pass filter limiting the bandwidth of the signal output on the transmission line. In one implementation example the value of a feedback resistor 220, 221 is R=2.1 kΩ and the value of a capacitor 230, 231 is C=800 fF. The feedback path in this way forms the single-pole low-pass filter for filtering 1000BT output signals in case the optional 17-level DAC is used. Furthermore and in case the 17-level DAC is used the value of the capacitor can be adjusted via an electrical signal, such that the frequency of the single-pole low-pass filter can be adjusted to a frequency of around 141 MHz. That is for processing 1000BT signals the feedback path forms a single-pole low-pass filter of around 94 MHz and for processing 100BT of around 141 MHz.

Besides forming a low-pass filter in connection with the parallel resistor the capacitors 230, 231 help to stabilize the operation of operational amplifiers 210, 211, because the feedback capacitors effectuate a zero in the open loop transfer function.

As the amplifiers 210, 211 keep the impedance Zout at their outputs low, i.e. ideally at 0Ω, the termination of the transmission line is achieved by two resistors 240 and 241 in series with the transmission line, each resistor having a value of 50Ω. The output swing in this way is doubled.

The operational amplifiers 210, 211 are designed as class-AB amplifiers to save power. With their bias current being strongly dependent on the symbol to transmit, the power consumption of the amplifiers is very low when no signal is output. Also the power consumption is almost directly proportional with the signal swing of the output signal for large swings. The theoretical power consumption limit for an ideal class-B amplifier is 16.5 mW from a 3.3 Volts supply for a random PAM-5 1000BT signal and 13.2 mW for a PAM-5 signal plus partial response filter transmission. Although power consumption of a class-AB amplifier is higher, it is still about two times lower than conventional solutions.

Circuit 200 comprises resistors 250, 251 and 260, 261 forming a filter for separating signals received on the transmission line when operating in 1000BT mode. For example the values of the resistors can be 2.5 kΩ for resistors 250, 251 and 1.25 kΩ for resistors 260, 261. As 100BT is a half-duplex mode the filter may also be used when receiving signals in 100BT mode. The received, separated signals Rx are then fed to a subsequent processing block—not shown—for further processing.

This exemplifying embodiment of the voltage mode line driver uses two single ended operational amplifiers. In an alternative embodiment a single differential line driver can be used, which substitutes the two single ended amplifiers. In this case the common mode voltage Vcm is arranged in the common mode feedback loop circuit.

Figure 3:
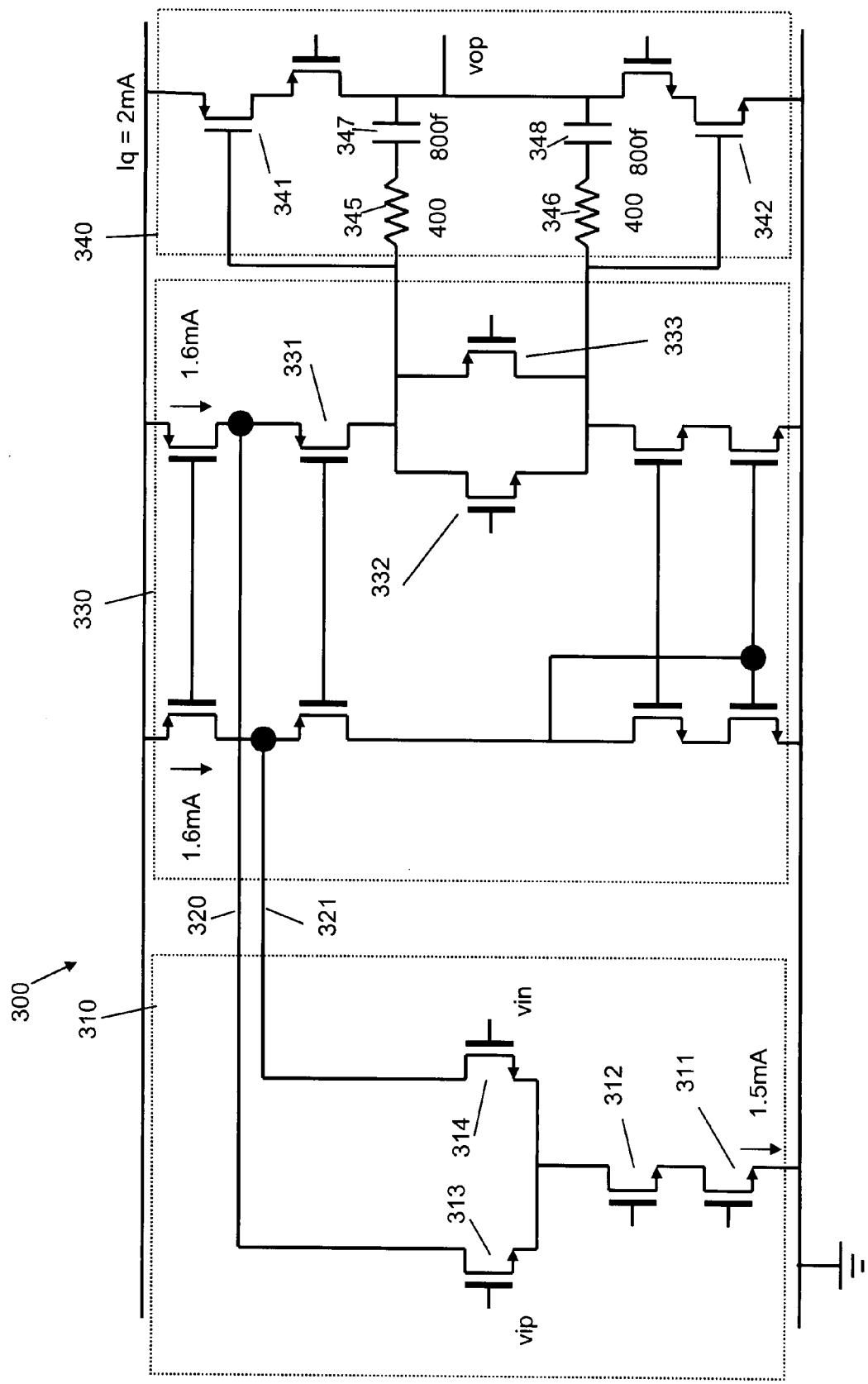
FIG. 3 depicts a circuit for a single ended amplifier

FIG. 3 shows a more detailed illustration of an embodiment of one of the two single ended operational amplifiers comprised in voltage mode line driver.

Operational amplifier 300 is class-AB and operated with 3.3 Volts supply voltage as indicated in the figure. The amplifier comprises a transconductance input stage 310 implemented with NMOS transistors 313, 314 connected through the folded cascode stage 330 to the class-AB biased output stage 350.

Stage 310 comprises two appropriately biased cascaded thick oxide NMOS transistors 311 and 312 as a current source for biasing. These allow a fixed (class A) current of 1.5 mA for the input stage. The positive input voltage Vip and the negative input voltage Vin are coupled as indicated to transistors 313 and 314.

The input transconductance stage is coupled to the folded-cascode stage 330 comprising appropriately biased and cascoded PMOS transistors that pass the signal 320 to the output stage through the cascode transistor 331 and an NMOS current mirror to invert the phase of signal 321 generated by the input stage such that the class-AB biasing mesh made of transistors 332,333 receives two in-phase signals at its ends, capable of driving the output stage 340 comprising two transistors 341, 342 connected as inverting amplifiers.

The output stage furthermore comprises a first resistor 345 in series with a miller capacitor 347 and a second resistor 346 in series with a second miller capacitor 348, which improve the stability of the amplifier, and wherein the value of resistors 345, 346 can be 400Ω and the value of capacitors 347, 348 can be 800 femto Farad.

The circuit can be implemented for example in 90 nm CMOS technology, wherein a thin oxide transistor is designed to hold a voltage of 1.2 Volts maximum and a thick oxide transistor is designed to hold at least a voltage of 2.5 Volts.

As mentioned above circuit 200 comprises two single ended amplifiers for example as described in FIG. 3, wherein the positive input of each of the amplifiers is coupled to a common mode voltage of half the supply voltage, which ideally is 1.65 Volts. Accordingly the positive input vip of both single ended amplifiers is coupled to the common mode voltage, whereas the negative input of one amplifier is coupled to the positive output signal from DAC 120 and the positive input of the other amplifier is coupled to the negative output signal from DAC 120. Analogously one of the amplifiers outputs a positive portion Vop and the other amplifier outputs a negative portion of the output signal Von.

Figure 4A:
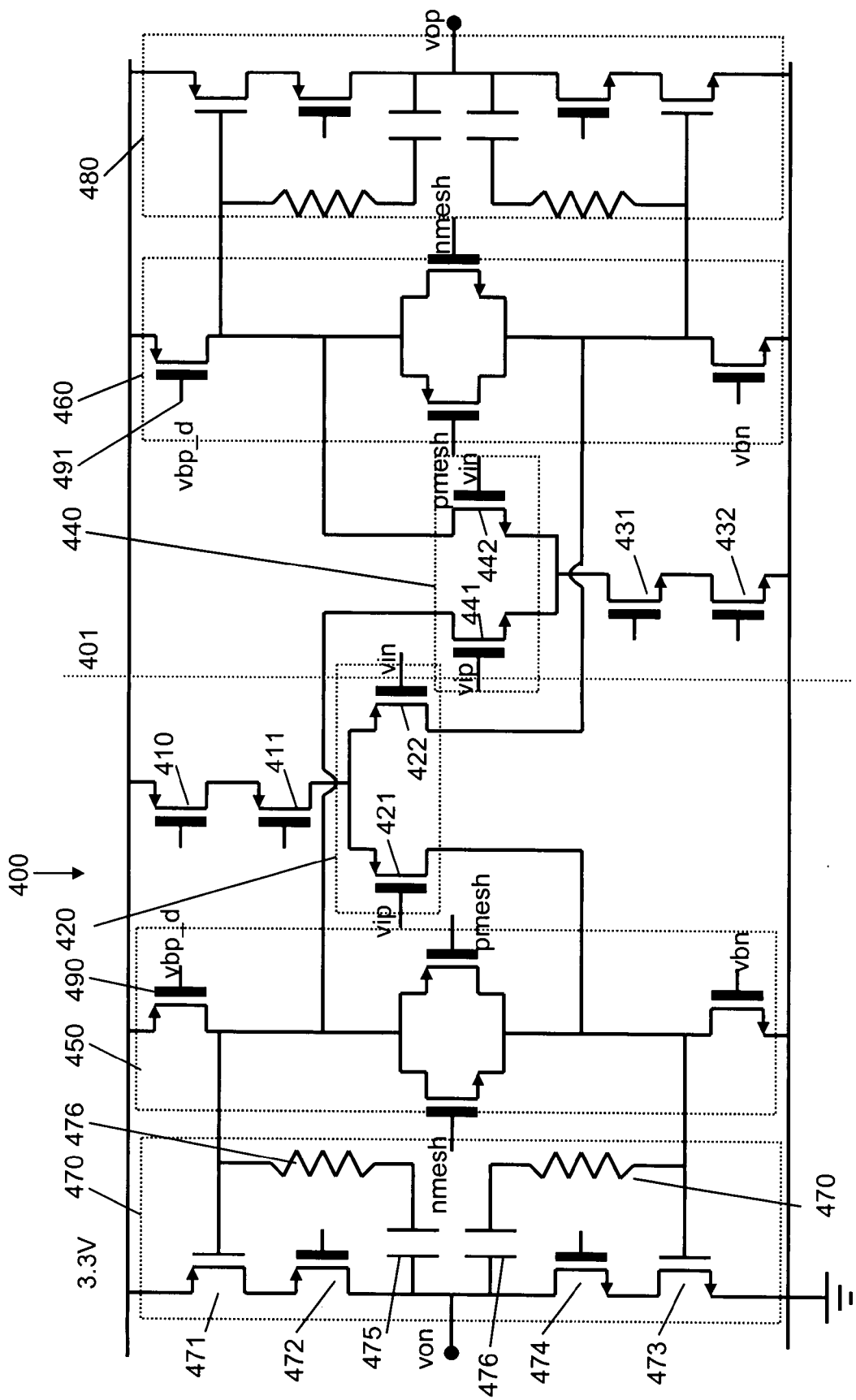
FIG. 4, a) depicts a circuit for a differential amplifier, b) depicts a circuit for producing a calibration voltage for the differential amplifier

Circuit 400 as illustrated in FIG. 4a exemplifies an embodiment of a differential operational amplifier, which can be used in the voltage mode line driver instead of the two single ended operational amplifiers. Note that different conventional topologies for differential operational amplifiers can be used also.

Differential amplifier 400 is operated at a voltage of ideally 3.3 Volts as indicated in the drawing. The amplifier is symmetrically built up as indicated by dotted mirror line 401, such that processing of signals for generating the negative output voltage Von and the positive output voltage Vop is performed by similar topologies, wherein the coupling to the supply line is inverted between the portions, such that the circuit portion on the left hand side of 401, which outputs the negative output voltage is coupled to the supply voltage of 3.3 Volts where the elements of the right hand portion of the circuit is coupled to ground or a reference potential. Furthermore some of the NMOS transistors have corresponding transistors formed as PMOS transistors in the other portion.

Cascoded thick oxide PMOS transistors 410, 411 provide a supply current to a transconductance input stage 420 comprising transistors 421, 422, to which the positive respectively the negative input signal from DAC 120 are coupled. Similarly cascoded thick oxide NMOS transistors 431, 432 provide a supply current to transconductance input stage 440 comprising transistors 441 and 442, to which the positive and respectively the negative input signals Vip, Vin from DAC 120 are coupled. In fact the gate of transistor 421 is shorted with gate of transistor 441 and the gate of 422 is shorted with the gate of 442. The output signals of the transconductance stages are passed through class-AB stages 450 and 460 to the output stages 470 and 480, wherein output stage 470 provides the negative output voltage Von and output stage 480 the positive output voltage Vop of differential amplifier 400 respectively.

The output stages 470, 480 are of similar topology as those described with reference to FIG. 3. For example stage 470 comprises a cascode of a thin oxide and a thick oxide PMOS transistor 471, 472 and a cascode of a thin oxide and a thick oxide NMOS transistor 473, 474, wherein each cascode has miller capacitor 475, 476 and a resistor 477, 478 in its feedback path.

The output stages and the class-AB stages are furthermore coupled to transistors 490, 491, which are coupled to a voltage vbp_d.

Figure 4B:
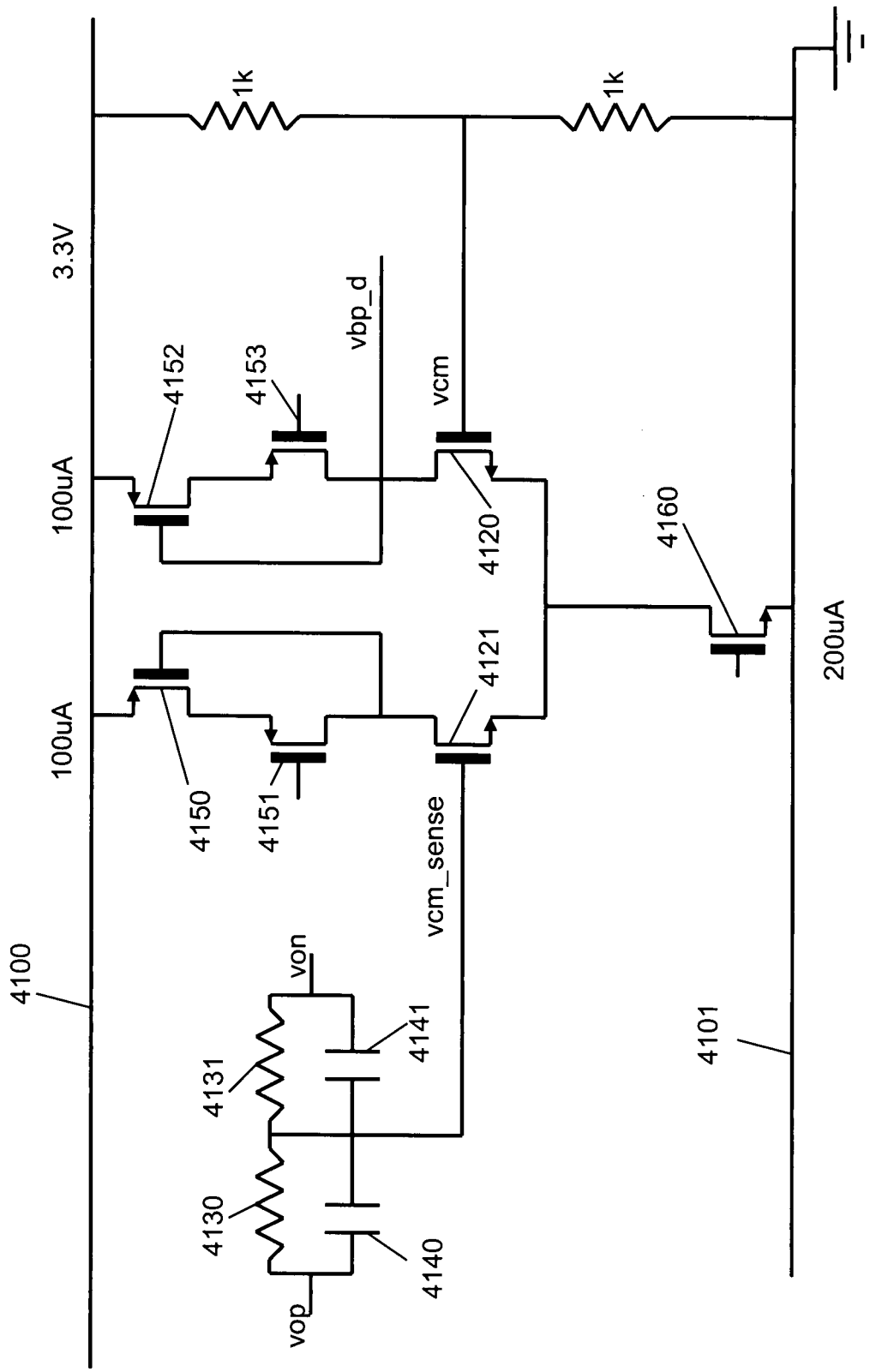

Voltage vbp_d is generated by a common feedback circuit as illustrated in FIG. 4b, wherein the upper line 4100 is coupled to supply voltage of 3.3 Volts and line 4101 is coupled to ground or any reference potential.

The common feedback circuit comprises a first voltage divider, which for example in this embodiment consists of a first and a second resistor of equal value, for example both being 1 kΩ in value. The center voltage Vcm produced by the voltage divider is half the supply voltage and is tapped as a bias voltage for thick oxide NMOS transistor 4120. A second voltage divider comprising resistors 4130 and 4131 is coupled to the output signal, i.e. to the output of the differential amplifier by coupling to its positive output voltage Vop and its negative output voltage Von respectively. Parallel to the resistors 4130, 4131 of this voltage divider is a capacitor 4140 and 4141 respectively. As the resistors and transistor 4121 comprise a parasitic capacitance to ground thus forming an unwanted RC low-pass filter, the capacitors parallel to the resistors enables Vcm_sense to react quickly to changes in the common mode voltage at vop and von respectively. The resistors and the capacitors respectively are of equal value, for example of 10 kΩ resistance and 100 femto Farad capacitance. As the values of the resistors and the capacitors are equal, the center voltage Vcm_sense of this second voltage divider is the common mode portion of the amplifier's output signal. The center voltage Vcm_sense is coupled as control voltage to thick NMOS transistor 4121. The current mirror comprising PMOS transistors 4150 to 4153 is tapped at the gate of transistor 4152 thus providing control voltage vbp_d, which is coupled to differential amplifier as shown in FIG. 4a.

Metaphorically speaking the circuit of FIG. 4b provides a calibration voltage vbp_d, which ensures the common mode output of the differential amplifier remains at half the supply voltage.

As indicated in the drawing each branch of the current mirror takes 100 microampere as input current, which is discharged via transistor 4160 as a 200 microampere current.

Figure 5:
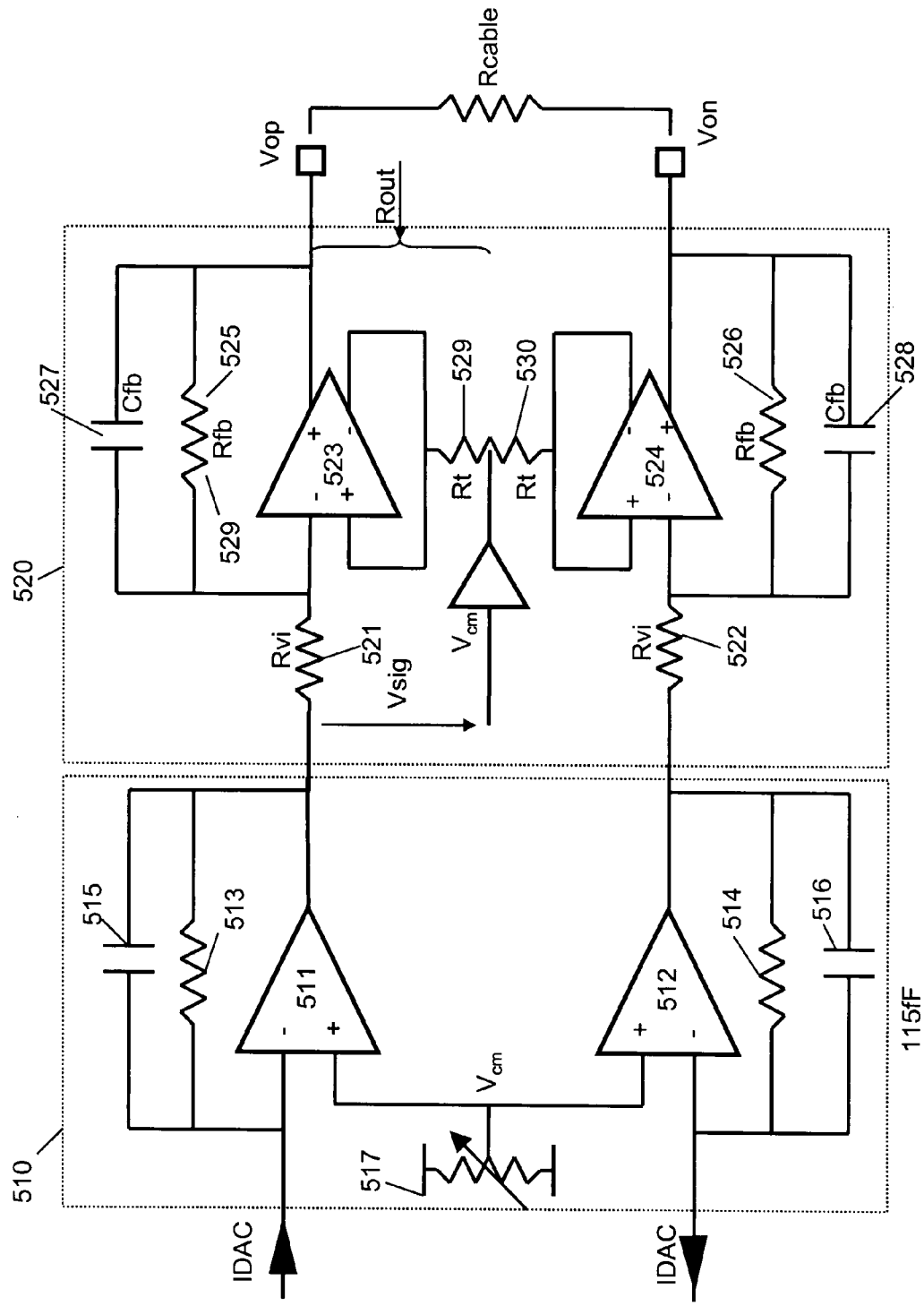
FIG. 5 depicts a first implementation of an active impedance output driver circuit

FIG. 5 depicts a first exemplary embodiment 500 of a circuit providing active output impedance.

In the exemplary disclosed circuit the DAC 120 provides an output current. As the active output impedance line driver as disclosed here requires a voltage as input signal the output current provided by the DAC must be transformed into a voltage to be fed into the active output impedance line driver. The current-to-voltage converter 510 as shown in FIG. 5 for example can do this transformation.

The current-to-voltage converter comprises first and second single ended amplifiers 511, 512, each having a resistor 513, 514 parallel to a capacitor 515, 516 in its feedback path. Exemplary values of these elements may be 1 kΩ for resistors 513, 512 and 115 femto Farad for capacitors 515, 516. Furthermore amplifiers 511 and 512 are coupled to voltage source 517 providing a direct voltage Vcm, which corresponds to the wanted common mode voltage of the output signal of the driver. Converter 510 provides a voltage at its output as the input current travels through the resistors and appropriately gets converted into an output voltage by action of the amplifier.

Note that any current-to-voltage topology may be used for converting the current as output by DAC 120 to a voltage as input for the active impedance output line driver 520. Furthermore and in case that the DAC is voltage-mode the active impedance output line driver can be coupled directly to the DAC.

The exemplified active impedance output line driver 520 can be seen as a pseudo-differential line driver. The driver 520 comprises two portions of identical topology, wherein one driver portion outputs the positive portion of the output signal and the other portion outputs the negative portion of the output signal.

Each portion of driver 520 comprises a first resistor Rvi 521, 522 coupled to the negative input of a differential amplifier 523, 524, which can be of any topology. In the negative feedback path of the amplifiers that is from the positive output to its negative input a resistor Rfb 525, 526 is arranged parallel to a capacitor Cfb 527, 528. As mentioned above the negative feedback paths around the differential amplifiers may form a single-pole low-pass filter of a frequency around 80 MHz, when using the optional 17-level DAC as mentioned above.

The positive feedback path, that is from the negative output of the amplifier to the its positive input terminal, is shorted and coupled via resistor Rt 529, 530 to a direct voltage source Vcm corresponding to the common mode voltage of the output signal.

Exemplary values for the passive components may be 1.5 kΩ for resistors 521, 522 and 9 kΩ for feedback resistors 525, 526 and 16.6Ω for resistor 529, 530 and a capacitance of 200 femto Farad for the feedback capacitors 527, 528.

For this topology the output impedance Rout for one portion of the active output impedance line driver as shown in the drawing is given as $$Rout = Rt \cdot \frac{Rvi + Rfb}{Rvi + Rt}$$

and the output voltage Vout is given as $$Vout = Vsig \cdot \frac{Rt - Rfb}{Rvi + Rt} \cdot \frac{Rcable}{Rcable + Rt\left(\frac{Rvi + Rfb}{Rvi + Rt}\right)}$$

Metaphorically speaking each of the two driver portions generates one half of the maximum output voltage required by 10BT protocol. That is the portion outputting the positive signal portion Vop generates a voltage above the common mode portion of the output signal.

This topology allows the circuit to be supplied with a supply voltage of less than the required output signal voltage defined for 10BT protocol. Accordingly amplifiers 523, 524 can be supplied with 3.3 Volts, which is less than maximum signal swing of 5 Volts defined for 10BT.

The topology of the optional 17-level DAC in combination with the feedback paths of the amplifiers comprised in the line drivers thus discloses a 17-level digital-to-analog converter (DAC) followed by a single-pole low-pass filter for producing an analog signal corresponding to a digital symbol, which the DAC receives as input. This combination can be used to process signals for 1000BT and 100BT and 10BT Ethernet signals, wherein each signal matches the requirements set forth in the 802.3 IEEE specification. In particular an integrated circuit (IC) is disclosed comprising a 17-level digital-to-analog converter (DAC) receiving digital symbols and at least one clock signal and outputting corresponding analog signals, and wherein the output of the DAC is switchable coupled to a voltage mode line driver for producing 1000BT and 100BT Ethernet signals and to an active output impedance line driver for producing 10BT Ethernet, wherein the feedback paths of the line drivers each comprises a single-pole low-pass filter.

Figure 6:
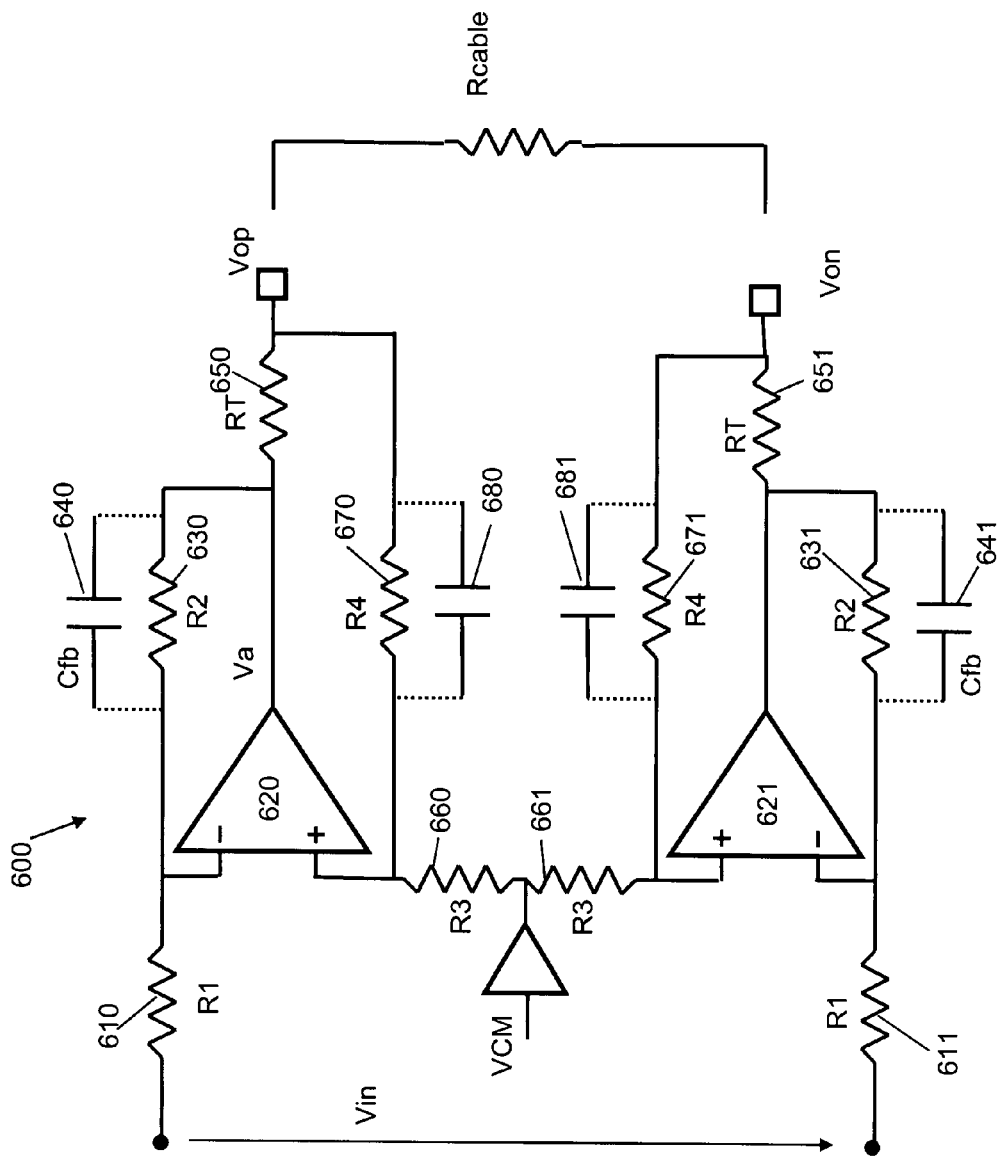
FIG. 6 depicts an alternative implementation of an active impedance output driver circuit.

FIG. 6 depicts an alternative implementation 600 of a pseudo differential active output impedance line driver, which may replace the line driver 520 as illustrated in FIG. 5. Similarly this implementation of an active output impedance line driver comprises two portions of identical topology, the upper portion providing the positive output signal Vop and the lower portion providing the negative output signal Von.

Each portion comprises an input resistor R1 610, 611 coupled to the negative input terminal of a single ended amplifier 620, 621 respectively. The negative feedback path of each amplifier comprises a resistor R2 630, 631 and an optional capacitor 640, 641. The output of amplifiers 620, 621 is coupled via a termination resistor Rt 650, 651 to the output pads, such that the termination resistor is in series with the amplifier 620, 621 respectively. The positive input of amplifiers is coupled via a resistor R3 to a direct voltage source Vcm, which thus provides a reference potential to the amplifiers 620, 621, such that a common mode voltage is provided to the output signals Vop and Von.

This reference voltage Vcm is also fed forward via resistor R4 670, 671 to the output pads of the driver, wherein optional capacitors 680, 681 may be arranged in parallel to resistors R4.

Example values for the elements may be 1.5 kΩ for resistors R1, 12 kΩ for resistors R2, 1.5 kΩ for resistors R3, 13.5 kΩ for resistors R4 and 5Ω for Rt. Capacitors Cfb may have 200 femto Farad and capacitors 681 may have also 200 femto Farad. Although resistor Rt is in series with the amplifiers the output of the line driver still can be seen as an active output impedance, because the value of Rt is at least one order of magnitude smaller than the output impedance.

From the above illustrated examples it is apparent to those skilled in the art that any line driver providing active output impedance may be used in the line driver circuit.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiments disclosed.

What is claimed is:

1. An electrical circuit comprising a line driver for providing wired Ethernet signals, the line driver comprising:
a multiplexing module configured to multiplex an analog signal to provide a first signal or a second signal responsive to a negotiated transmission speed;
a voltage mode line driver, coupled to the multiplexing module, configured to produce 100BT or 1000BT wired Ethernet signals responsive to the first signal; and
an active output impedance line driver, coupled to the multiplexing module, configured to produce 10BT wired Ethernet signals responsive to the second signal.

2. The circuit of claim 1, wherein the voltage mode line driver comprises two single ended operational amplifiers configured as a pseudo-differential amplifier.

3. The circuit of claim 1, wherein the voltage node line driver comprises a differential amplifier.

4. The circuit of claim 3, wherein an output stage of the differential amplifier is coupled to a calibration voltage to calibrate a common mode voltage of an output signal of the differential amplifier.

5. The circuit of claim 4, wherein the calibration voltage is half of a supply voltage of the differential amplifier.

6. The circuit of claim 4, wherein an output of the differential amplifier and a supply voltage are fed into a calibration circuit configured to produce the calibration voltage being half the supply voltage.

7. The circuit of claim 3, wherein the differential amplifier comprises a single-pole low-pass filter in a feedback path of the differential amplifier.

8. The circuit of claim 7, wherein the single-pole low-pass filter comprises an adjustable capacitor for adjusting a frequency of the single-pole low-pass filter.

9. The circuit of claim 8, wherein the frequency of the single-pole low-pass filter is adjusted to around 94 MHz for processing 1000BT signals and to a frequency of around 141 MHz for processing 100BT signals.

10. The circuit of claim 2, wherein the pseudo-differential amplifier comprises a single-pole low-pass filter in a feedback path of the pseudo-differential amplifier.

11. The circuit of claim 10, wherein, the single-pole low-pass filter comprises an adjustable capacitor for adjusting a frequency of the single-pole low-pass filter.

12. The circuit of claim 11, wherein the frequency of the single-pole low-pass filter is adjusted to around 94 MHz for processing 1000BT signals and to a frequency of around 141 MHz for processing 100BT signals.

13. The circuit of claim 1, wherein the active output impedance line driver comprises an operational amplifier having a single-pole low-pass filter in a feedback path of the operational amplifier.

14. The circuit of claim 13, wherein the frequency of the single-pole low-pass filter is at a frequency of around 80 MHz.

15. The circuit of claim 1, wherein the active output impedance line driver is inactive while the voltage mode line driver produces the 100BT or 1000BT wired Ethernet signals, and wherein the voltage mode line driver is inactive while the active output impedance line driver produces the 10BT wired Ethernet signals.

16. The circuit of claim 1, wherein the voltage mode line driver has an output impedance of approximately zero Ohms.

17. The circuit of claim 16, wherein the active output impedance line driver has an output impedance greater than approximately zero Ohms.

18. The circuit of claim 1, wherein the voltage mode Line driver is configured to receive the first signal being clocked by an appropriate clock signal corresponding to the 100BT or 1000BT wired Ethernet signals, and the active output impedance line driver is configured to receive the second signal being clocked by an appropriate clock signal corresponding to the 10BT wired Ethernet signals.

19. The circuit of claim 1, wherein the multiplexing module comprises two current-steered field-effect transistors.

20. The circuit of claim 15, further comprising:
a connection pad configured to output the 10BT wired Ethernet signals produced by the active output impedance line driver, or the 100BT or 1000BT wired Ethernet signals produced by the voltage mode line driver, to a transmission line;
wherein the voltage mode line driver outputs a first impedance to the transmission line that is larger than a characteristic impedance of the transmission line when the voltage mode line driver is inactive; and
wherein the active output impedance line driver outputs a second impedance to the transmission line that is larger than the characteristic impedance of the transmission line when the active output impedance line driver is inactive.

21. A method for producing an Ethernet signal, comprising:
multiplexing an analog signal by a multiplexing module to provide a first signal or a second signal responsive to a negotiated transmission speed; and
producing an Ethernet signal comprising:
a 100BT or a 1000BT Ethernet signal at a voltage mode line driver coupled to the multiplexing module responsive to the first signal; or
a 10BT Ethernet signal at an active output impedance line driver coupled to the multiplexing module responsive to the second signal.

22. The method of claim 21, further comprising:
processing digital symbols to be transmitted as the Ethernet signal by a digital-to-analog converter to form the analog signal that is multiplexed to provide the first or the second signal.

23. The method of claim 22, wherein the processing further comprises:
receiving a clock signal of 160 MHz at the digital-to-analog converter when the negotiated transmission speed comprises a 10BT mode; and
outputting a 10BT signal from the digital-to-analog converter for multiplexing when the negotiated transmission speed comprises the 10BT mode, the 10BT signal being oversampled 16 times, the samples forming a raised cosine.

24. The method of claim 22, wherein the second signal comprises a current-mode signal, the method further comprising:
converting the second signal by a current-to-voltage converter; and
feeding the converted second signal into the active output impedance line driver.

25. The method of claim 22, wherein the processing further comprises:
introducing, by the digital-to-analog converter, an, intermediate step in a rising edge and a falling edge of the analog signal when the negotiated transmission speed comprises a 100BT mode.

26. The method of claim 21, further comprising:
setting the negotiated transmission speed to a 10BT mode and activating the active output impedance line driver at system power up;
changing the negotiated transmission speed to a 100BT or a 1000BT mode during an ongoing transmission;
deactivating the active output impedance line driver in response to the changing; and
activating the voltage mode line driver in response to the changing.

27. The method of claim 21, further comprising:
passing the first signal through a first single-pole low-pass filter of adjustable frequency in the voltage mode line driver, and
passing the second signal through a second single-pole low-pass filter in the active output impedance line drivel.

28. The method of claim 27, further comprising:
adjusting the first single-pole low-pass filter in the voltage mode line driver to a frequency of approximately 94 MHZ when the negotiated transmission speed comprises a 1000BT mode to produce the 1000BT Ethernet signal; and
adjusting the first single-pole low-pass filter in the voltage mode line driver to a frequency of approximately 141 MHZ when the negotiated transmission speed comprises a 100BT mode to produce the 100BT Ethernet signal.

29. The method of claim 27, wherein a frequency of the second single-pole low-pass filter in the active impedance line driver is approximately 80 MHz when the negotiated transmission speed comprises a 10BT mode to produce the 10BT Ethernet signal.

30. An integrated circuit comprising:
a digital-to-analog converter (DAC) configured to output an analog signal;
a multiplexing module configured to multiplex the analog signal to provide a first signal or a second signal responsive to a negotiated transmission speed;
a voltage mode line driver coupled to the multiplexing module and configured to produce 100BT or 1000BT Ethernet signals responsive to the first signal, the voltage mode line drivel comprising a first feedback path; and
an active output impedance line driver coupled to the multiplexing module and configured to produce 10BT Ethernet signals responsive to the second signal, the active output impedance line driver comprising a second feedback path;
wherein each feedback path comprises a single-pole low-pass filter.

31. The integrated circuit of claim 30, wherein the DAC comprises a 17-level DAC.

32. The integrated circuit of claim 30, wherein the DAC, when the negotiated transmission speed comprises a 10BT mode, receives a clock signal of 160 MHZ and is configured to oversample the analog signal 16 times.

33. The integrated circuit of claim 30, wherein the active output impedance line driver is inactive while the voltage mode line driver produces the 100BT or 1000BT Ethernet signals, and wherein the voltage mode line driver is inactive while the active output impedance line driver produces the 10BT Ethernet signals.

34. The integrated circuit of claim 33, further comprising:
a connection pad configured to output the 10BT Ethernet signals produced by the active output impedance line driver, or the 100BT or the 1000BT Ethernet signals produced by the voltage mode line driver, to a transmission line;
wherein the voltage mode line driver outputs a first impedance to the transmission line that is larger than a characteristic impedance of the transmission line when the voltage mode line driver is inactive; and
wherein the active output impedance line driver outputs a second impedance to the transmission line that is larger than the characteristic impedance of the transmission line when the active output impedance line driver is inactive.

35. The integrated circuit of claim 30, wherein the voltage mode line driver is configured to receive the first signal clocked by an appropriate clock signal corresponding to the 100BT or the 1000BT Ethernet signals, and the active output impedance line driver is configured to receive the second signal clocked by an appropriate clock signal corresponding to the 10BT Ethernet signals.

36. The integrated circuit of claim 30, wherein the multiplexing module comprises two current-steered field-effect transistors.

* * * * *

UNITED STATES PATENT AND TRADEMARK OFFICE
CERTIFICATE OF CORRECTION

PATENT NO. : 8,598,906 B2  
APPLICATION NO. : 11/798334  
DATED : December 3, 2013  
INVENTOR(S) : van der Goes et al.

Page 1 of 1

It is certified that error appears in the above-identified patent and that said Letters Patent is hereby corrected as shown below:

In the Claims

Column 10, Line 11, please replace "voltage node line" with --voltage mode line--.

Column 10, Line 61, please replace "voltage mode Line" with --voltage mode line--.

Column 12, Line 6, please replace "impedance line drivel" with --impedance line driver--.

Column 12, Line 33, please replace "mode line drivel" with --mode line driver--.

Signed and Sealed this  
Third Day of June, 2014

Michelle K. Lee  
*Deputy Director of the United States Patent and Trademark Office*